United States Patent [19]

Welch et al.

[11] 4,186,612
[45] Feb. 5, 1980

[54] TUNER DRIVING MECHANISM PERMITTING PLAY IN LOCATION OF INPUT MEMBER

[75] Inventors: Robert F. Welch, Albuquerque, N. Mex.; Russell D. Stamm, El Paso, Tex.

[73] Assignee: General Instrument Corporation, Clifton, N.J.

[21] Appl. No.: 861,857

[22] Filed: Dec. 19, 1977

[51] Int. Cl.² ............................................. F16H 35/18
[52] U.S. Cl. ...................................... 74/10.8; 74/380; 74/384; 334/7
[58] Field of Search ..................... 74/380, 384, 10.8; 334/7

[56] References Cited

U.S. PATENT DOCUMENTS

| | | | |
|---|---|---|---|
| 1,274,991 | 8/1918 | Clark | 74/384 |
| 3,191,452 | 6/1965 | Lipski | 74/384 |
| 3,274,844 | 9/1966 | Reitz | 74/384 |
| 3,762,272 | 10/1973 | Escobedo | 74/384 |
| 3,964,320 | 6/1976 | Gordon | 74/10.8 |
| 4,062,243 | 12/1977 | Clark | 74/10.8 |

FOREIGN PATENT DOCUMENTS

| | | | |
|---|---|---|---|
| 760995 | 11/1956 | United Kingdom | 74/380 |
| 953267 | 3/1964 | United Kingdom | 74/10.8 |
| 1141884 | 2/1969 | United Kingdom | 74/380 |

*Primary Examiner*—Charles J. Myhre
*Assistant Examiner*—R. C. Turner
*Attorney, Agent, or Firm*—James & Franklin

[57] ABSTRACT

A communication set tuner has a control member which varies the tuning status of the set; a rotatable input member is provided for driving the control member; the driving connection between the input member and the control member is so designed that the input member may be positioned on the set in any one of a large plurality of available positions. Thus a single driving mechanism structure may be provided which can be used in many different set environments calling for specifically different locations of the input member.

30 Claims, 11 Drawing Figures

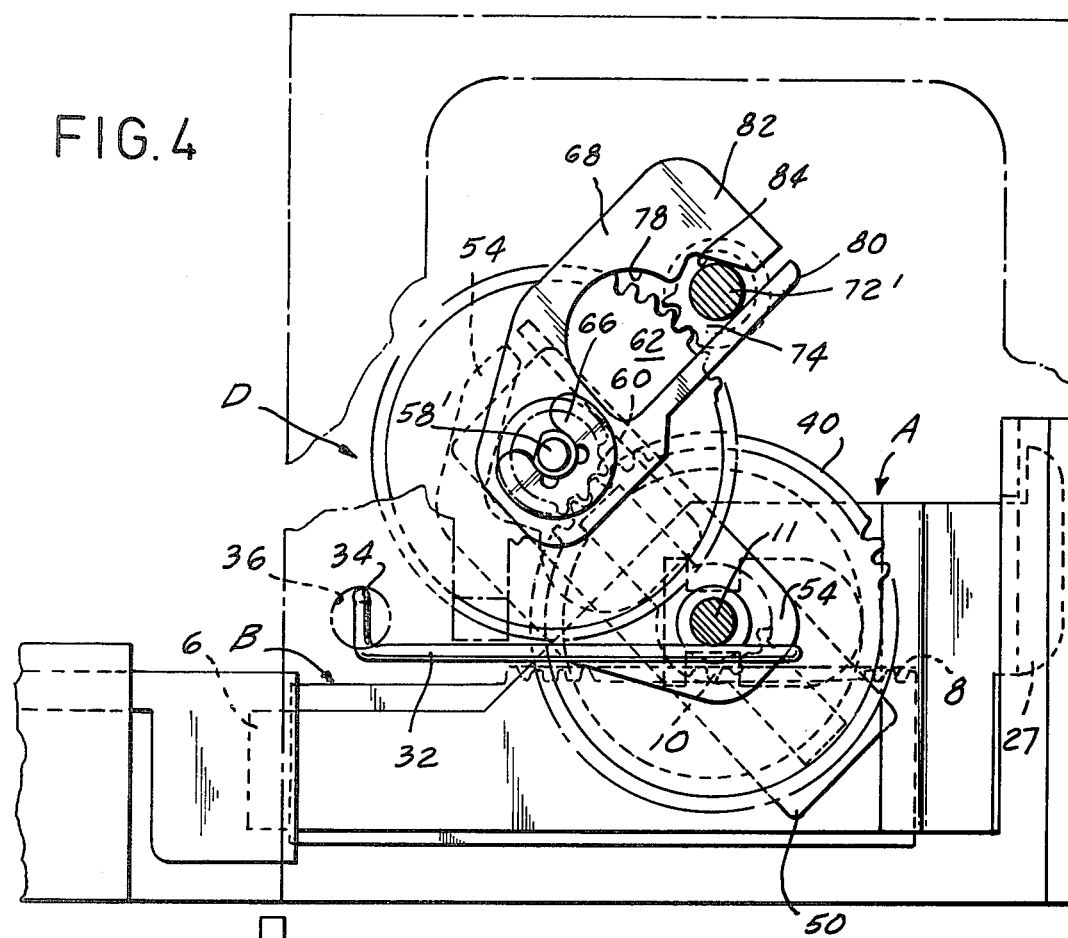
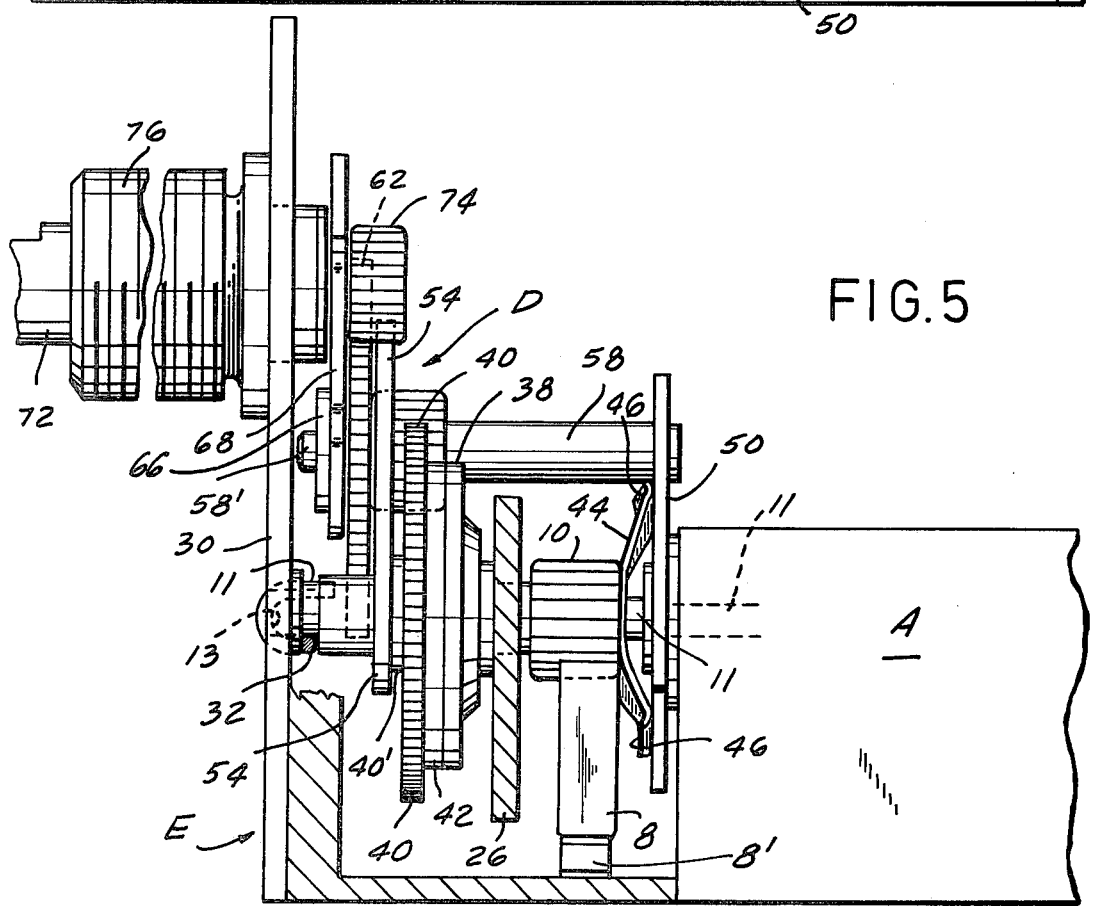

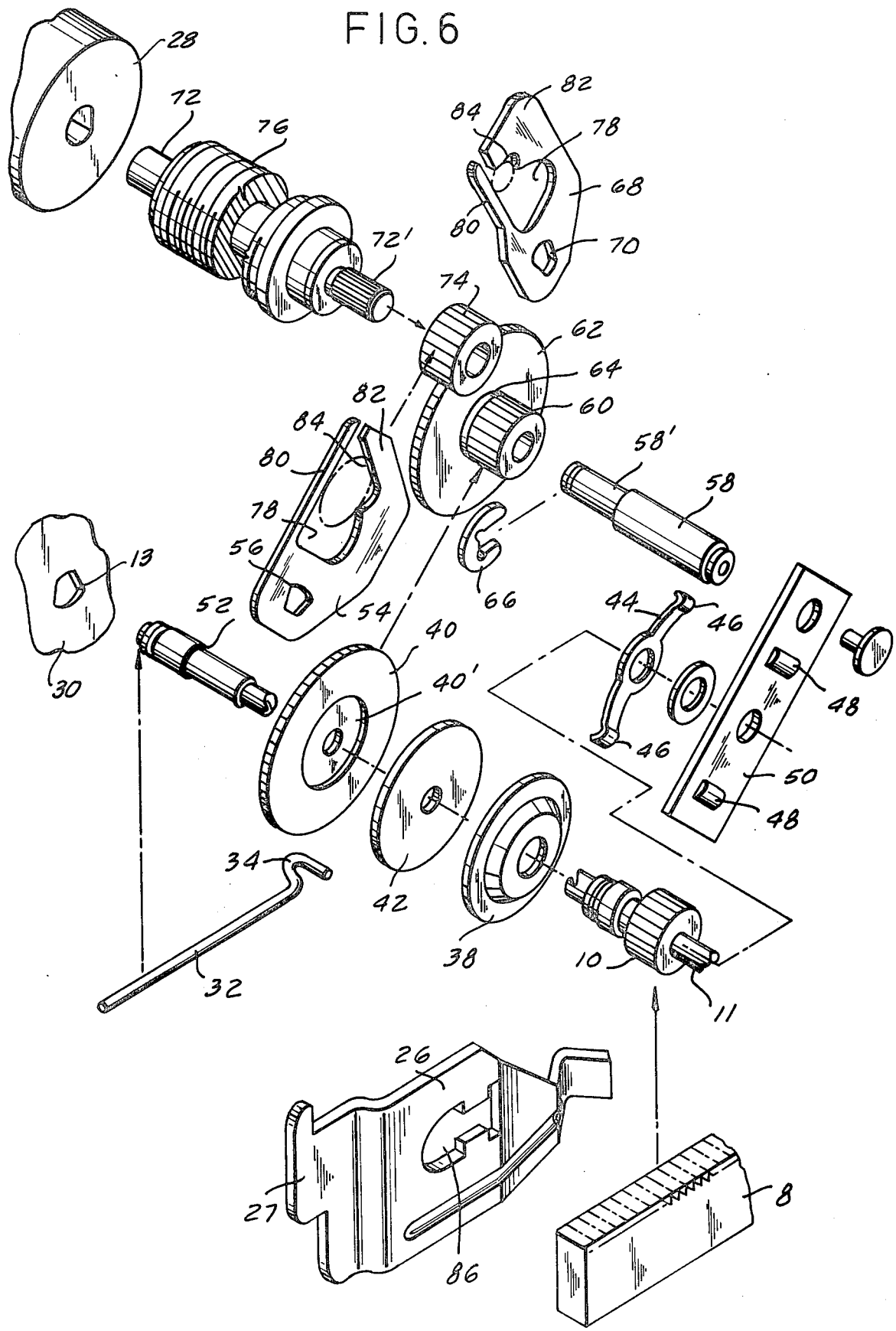

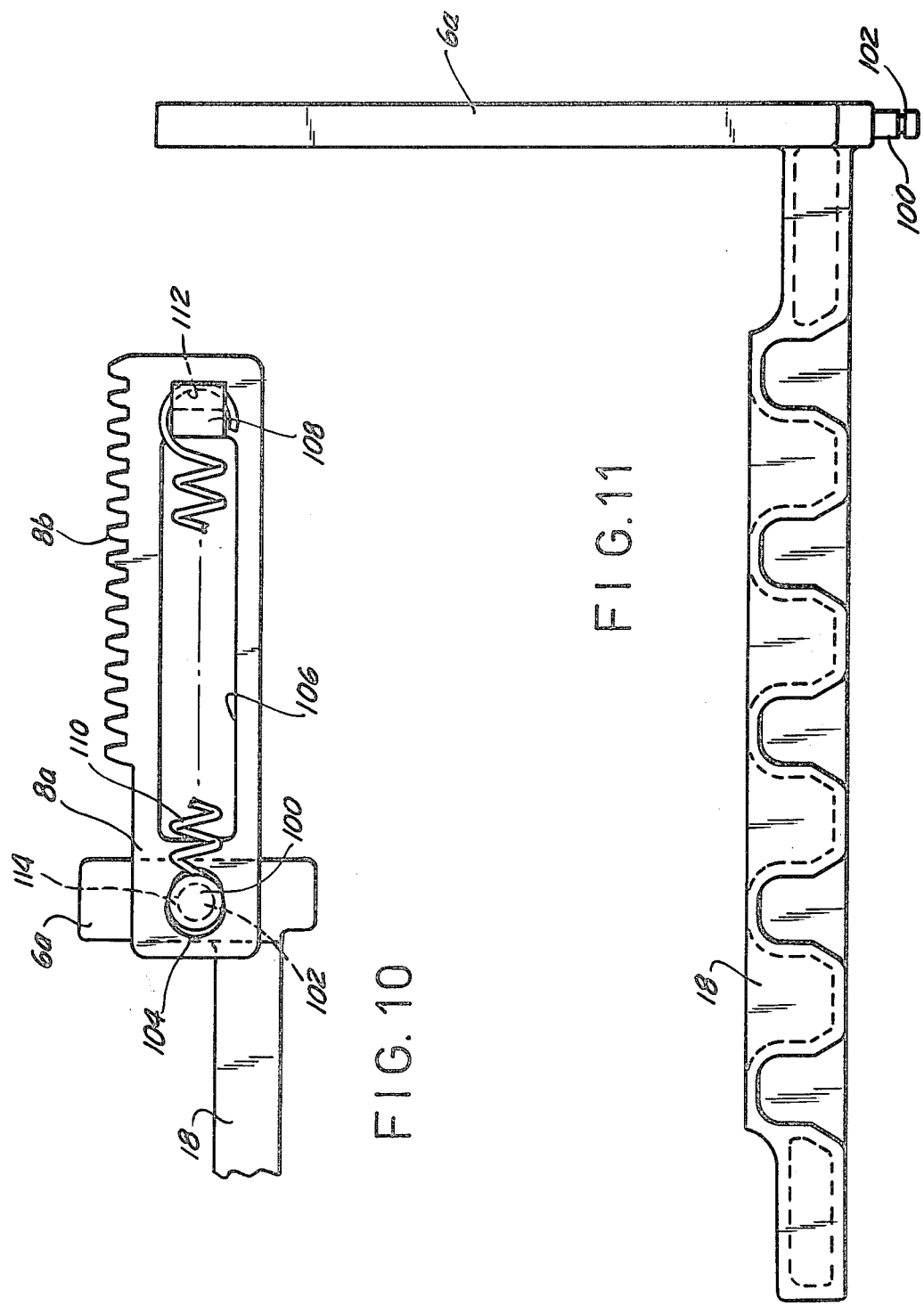

TUNER DRIVING MECHANISM PERMITTING PLAY IN LOCATION OF INPUT MEMBER

The present invention relates to a communications receiver, such as a radio set, in which a rotatable input member is operatively connected to the control member of the tuning system by mechanism which permits the input member to be located in a wide variety of positions relative to the control member, thereby enabling a single tuner structure to be used in a wide variety of different set environments.

Most communication receivers, such as radio sets, are provided with an input member, usually manually rotatable, which is moved to control the tuning status of the set. Movement of that input member is communicated to a control member for the tuning instrumentality per se, usually by means of a mechanical connection including gearing. In this way manual manipulation of the input member causes the set to tune from one station or channel to another. In many instances a given radio set may have two types of tuning, one a more or less continuous tuning arrangement, whereby the set may be tuned controllably from one end of its range to the other, and the second, typically actuated by pushbuttons, which will automatically tune the set to one of a predetermined limited number of preselected stations. In the latter case it is conventional to disconnect or declutch the continuous manual tuning system whenever the pushbutton tuning system is actuated.

The means for effecting movement of the control member of the tuning system in response to movement of the input member or of the pushbuttons is generally mechanical in nature. The tuner itself, while utilizing mechanical parts, is essentially electrical (electronic or semiconductor) in nature. Hence it is frequently the case that the mechanical assemblies involved in a tuner are made by one company and the frame and the electrical portions of the tuner are made by another company, the mechanical and electrical assemblies being assembled to one another. The mechanical tuner assembly therefore is a product which is often purchased from a third party by the assembling company (usually the set manufacturer). Since it is the set manufacturer who determines the particular arrangement of the various elements accessible to the user of the set (tuning knobs, pushbuttons, switches, volume control, indicator dial and the like), and since the arrangement of those instrumentalities is often dictated as much by aesthetic as by functional considerations, it is the rule rather than the exception for the specific relative locations of the tuning system control member and the input member to vary relatively widely from one set manufacturer's requirements to another, and even to vary widely from one set manufacturer's model to another. This presents a troublesome problem to the manufacturer of the mechanical assemblies used in the tuner, and has in the past generally required that the manufacturer of the mechanical assemblies produce different mechanical assemblies for different set manufacturers, and even different mechanical assemblies for the different model requirements of a given set manufacturer. This represents a significant source of added expense to the mechanical unit manufacturer, not only as to design and manufacture but also as to stocking in inventory.

The structural arrangement here disclosed successfully avoids that problem. Through the use of the present invention the manufacturer of the mechanical tuning assemblies need provide only a single standardized driving arrangement between input member and control member, which driving arrangement is so constructed and arranged that the input member may be positioned virtually anywhere within reason relative to the control member without requiring any change whatsoever in the structure of that standardized model.

The structure of the present invention employs gearing. One problem with gearing, particularly disadvantageous in a communications tuner where smoothness and accuracy of operation is called for, is backlash between the gears. Generally the greater the number of gears involved in a given transmission of motion the greater is the backlash problem, and since a significant number of gears must be employed in order to achieve the adjustable input member positioning feature which is so important to the present invention, backlash would appear to be a significant potential problem. However, that portential drawback to the instant invention has been eliminated through the incorporation into the standardized structure of inexpensive but reliable elements which effectively resiliently press the gears into firm engagement, thereby substantially eliminating backlash.

The present invention is particularly adapted for use in the manual tuning portion of a combined manual-and-pushbutton-tuner, with the manual drive being disconnected or declutched when the pushbutton tuning is actuated, and the invention will be here specifically disclosed in such an environment, but it will be apparent that this is by way of exemplification only, and that the invention in its broader aspects is not limited to that specific application. Moreover, the invention will be here specifically disclosed in connection with a tuner specially designed for use with a radio set installed in an automobile or other vehicle, but again that is by way of exemplification only and the invention is not limited thereto.

It is a prime object of the present invention to devise a mechanical arrangement for use between the input member of the control member of a tuning system which will permit a single standardized mechanical arrangement to be used in a wide variety of environments calling for a wide variety of locations for the input member relative to the control member.

It is another object of the present invention to devise such an arrangement in which accuracy and smoothness of operation is not sacrificed, and in which backlash is substantially eliminated.

It is yet another object of the present invention to devise such a structure which is small, compact and light, so that it can be used in applications where space and size must be minimized.

It is a further object of the present invention to devise such an arrangement which may be manufactured and assembled easily and inexpensively, without requiring any very high degree of precision in the various components thereof.

It is yet another object of the present invention to provide an improved mechanical connection between parts of the manual tuning drive which will minimize lost motion and backlash and permit appreciable warpage or distortion of structural parts without adversely affecting accuracy of operation.

To the accomplishment of the above, and to such other objects as may hereinafter appear, the present invention relates to a tuner construction having a specially organized operative driving connection between the tuner control member and the input member to the system, as defined in the appended claims, and as described in this specification, taken together with the accompanying drawing, in which:

FIG. 4 is a front elevational view of the arrangement of FIG. 2;

FIG. 5 is a side elevational view, with some parts broken away, of the arrangement of FIG. 2;

FIG. 6 is a three-quarter perspective exploded view of the operative parts making up the instant invention;

FIG. 10 is a side elevational view showing a preferred construction for connecting the tuning bar with the rack; and FIG. 11 is a top plan view of the tuning bar shown in FIG. 10.

Figure 1:
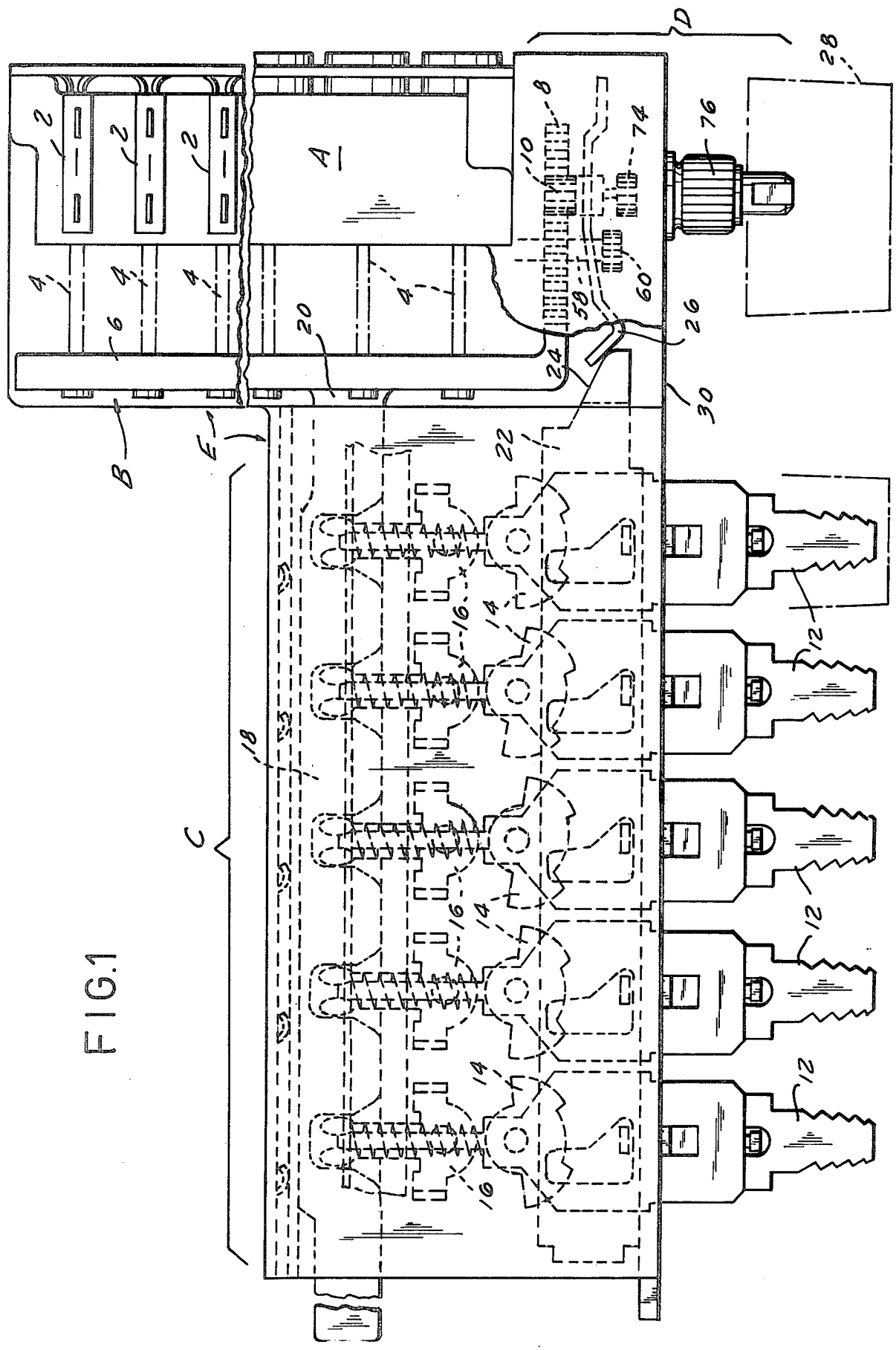
FIG. 1 is a top plan view of a pushbutton tuner in which the instant invention is embodied.
Figure 2:
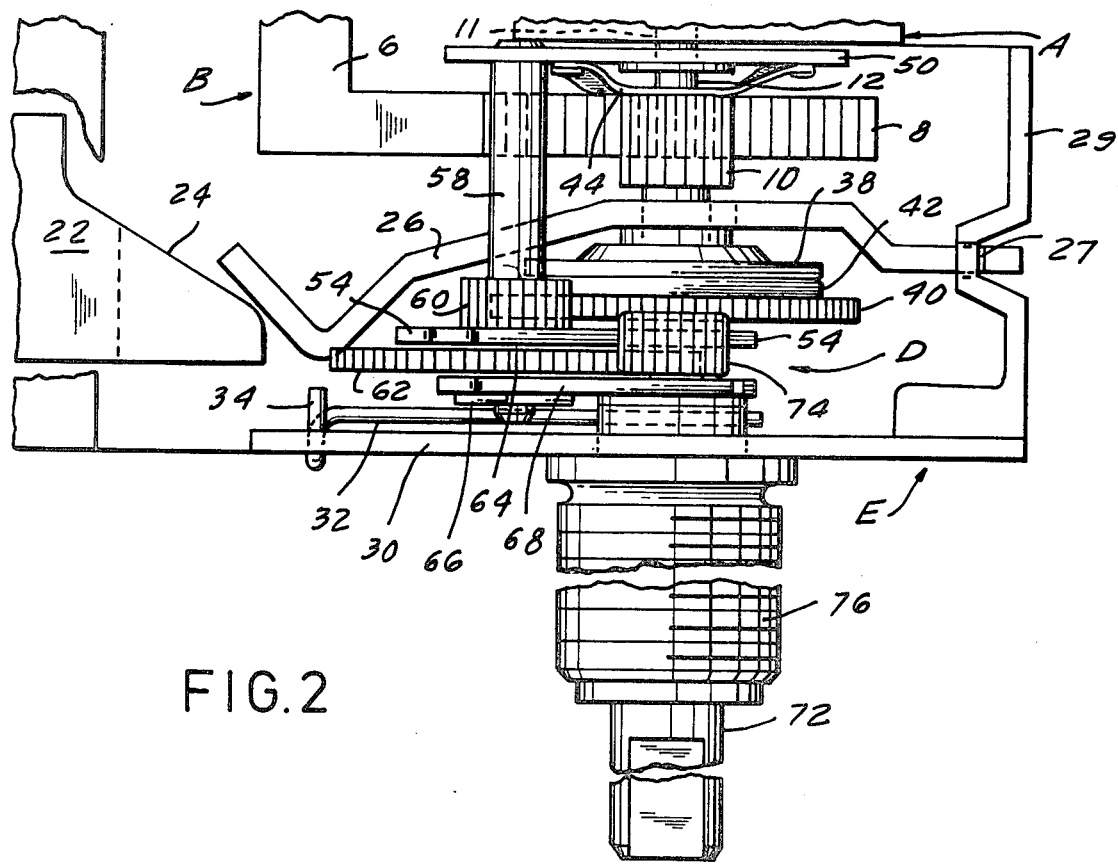
FIG. 2 is a top plan view of a preferred embodiment of the instant invention, shown in its normal condition for manual drive of the tuning system, and with the input member clutch-connected to the control member of the tuner.
Figure 3:
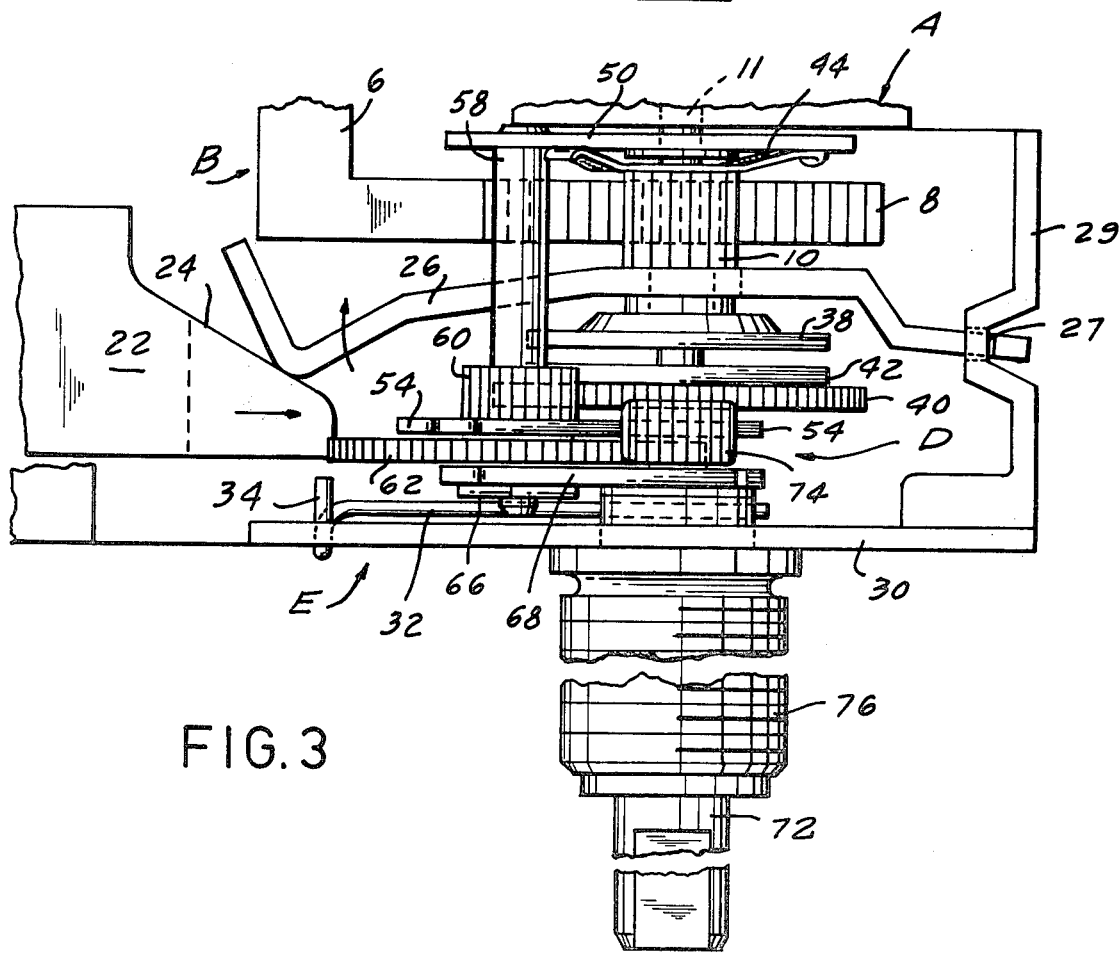
FIG. 3 is a view similar to FIG. 2 but showing the positions that parts assume when one of the pushbutton keys is depressed and the input member is declutched from the tuner control member.

As may be seen from FIG. 1, the tuner comprises an electrical tuning system generally designated A which is tuned by the adjustable positioning of a movable control member generally designated B. As here specifically disclosed the tuning system A may comprise a plurality of coils received within housings 2, which coils are tuned by the adjustable telescoping thereinto of cores 4, those cores being fixedly but adjustably mounted on a tuning bar 6. That tuning bar 6 is moved toward and away from the coil housings 2, thereby causing the cores 4 to telescope thereinto and out therefrom, by means of a rack 8 connected to the bar 6 and threadedly engaged by a driving pinion 10. A spring 8' compressed between the rack 8 and the bottom wall of the housing urges the parts 8 and 10 into meshing engagement.

The tuner A, as disclosed, is provided with two different tuning systems, a pushbutton tuning system generally designated C and a continuous tuning system generally designated D. The details of the pushbutton tuning system C are not part of this invention (they are described more in detail in the copending patent application Ser. No. 861,855 filed Dec. 19, 1977, entitled "Low Profile Pushbutton Tuner," with Robert Monath and Russell D Stamm as inventors and assigned to the assignee of this application) and hence it will be sufficient for the purposes of this application to state simply that depression of a selected one of the individual pushbutton keys 12 will, by means of the cams 14 adjustably positionable thereon, cause arms 16 to pivot, the pivoting of those arms causing carriage 18 to translate laterally to a degree dependent upon the rotatable position of the cam 14 on the particular pushbutton 12 that is depressed, the carriage 18 being fixed to the bar 6 at 20 so that lateral movement of the carriage 18 causes the bar 6, and hence the cores 4, to assume the position desired for tuning a particular station corresponding to the particular pushbutton 12 that has been depressed. Whenever a pushbutton 12 is depressed, a second bar 22 will be translated to the right as viewed in FIG. 1, and the cam surface 24 at the right-hand end of that bar 22 will engage clutch lever 26, pivoting that lever in a clockwise direction as viewed in FIG. 1 about its right-hand end 27 on wall 29. This will have the effect of disconnecting the manual drive D from the bar 6, and thus will facilitate the ease with which the selected pushbutton 12 can achieve the desired tuning position for the bar 6 and the cores 4.

It is to the continuous drive arrangement generally designated D that the instant invention relates. That manual drive D is designed to provide an operative driving connection between the manually accessible knob 28 located on the outside of the front wall 30 of the tuning assembly and the gear 10 which meshes with the rack 8. It will be appreciated that rotation of the gear 10 will cause the rack 8 to translate and thus will control the degree to which the cores 4 penetrate the coil housing 2, and thus the electrical tuning status of the tuner A. The various parts of the tuner A, the pushbutton tuning drive C, and the manual tuning drive D are structurally connected to one another by a frame generally designated E. This frame E and the parts connected thereto are mounted on some base structure within, for example, the cabinet of a radio set or the dashboard of an automobile. Different set manufacturers have different ideas about where the manual knob 28 should be located, even varying that location relative to the gear 10 as between different ones of its own models. It is this variation in location of the knob 28 relative to the tuner A which presents the cost problem to the manufacturer of the tuners themselves. For example, having reference to FIGS. 7, 8 and 9, current requirements of set manufacturers as conveyed to applicant's assignee, call for location of the axis of the manual tuning knob 28 at various points within the rectangle shown on FIGS. 7, 8 and 9 the corners of which are identified by the reference numerals A1, A2, A3 and A4. To manufacture specifically different structures to meet the specific requirements of the various set manufacturers for their various models is quite onerous. As shall be shown, the structure of the present invention enables a single structure to adapt itself to locate the axis of the tuning knob 28 anywhere within that rectangle, and indeed even in a wide variety of positions outside that rectangle, without requiring any modification whatsoever in the manufactured structure.

To this end the gear 10 which drives the rack 8 is freely rotatably mounted on a pin drive shaft 11. One end of that drive shaft is received within an opening 13 in the front wall 30 which has tapering upper edges defining what may be described as a pear-shape, the shaft end being pressed up into the tapered portion of the opening 13 by means of spring wire 32 one end 34 of which is anchored in an opening 36 in that front wall 30. The other end of the shaft 11 is received within another pear-shaped opening (not shown) in the tuner housing A and is urged into the tapered portion of the opening by the spring 8' subsequently to be described. Fixedly secured to the gear 10 for rotation therewith about the shaft 11 is a clutch plate 38. A gear 40 is mounted on the shaft 11 and a clutch facing 42 is interposed between the gear 40 and the clutch plate 38. A bowed declutch spring 44 is received over the shaft 11 and its ends 46 are received within recesses 48 formed in a pivot link 50 which is rotatably received on the shaft 11 and which is pressed by the spring 44 against the front face of the tuner housing A. The spring 44 is effective to push the clutch plate 38 to the left as viewed in FIG. 5, thereby to compress the clutch facing 42 between the clutch plate 38 and the gear 40, movement of the gear 40 axially along the shaft 11 to the left as viewed in FIG. 5 being prevented by the shoulder 52 on that shaft (See FIG. 6). A lower spring link 54 is provided with a pear-shaped opening 56 through which the shaft 11 extends, that link engaging the shoulder 52, the laterally displaced central portion 40' of the gear 40 in turn abutting against the link 54. The force exerted by the declutch spring 44 is sufficient to produce an effective frictional connection between the gear 40 and the clutch plate 38, thereby to transmit rotation of the gear 40 to the clutch plate 38 and to the pinion 10.

Mounted on the laterally extending end of the rear pivot link 50 is a stand-off 58, and rotatably mounted on the outwardly extending reduced diameter portion 58' of the stand-off 58 is a gear assembly comprising a pinion gear 60 and a larger gear 62, with a smooth surface 64 therebetween. The unit defined by the pinion 60, the gear 62 and the surface 64 is retained on the stand-off portion 58' by a retaining ring 66. The pinion 60 is maintained in meshing engagement with the gear 40 by means of spring link 54 and may ride around the periphery of the gear 40 in the fashion of a planetary gear, the gear pivot link 50 pivoting around the shaft 11 to permit such movement of the pinion 60. An upper spring link 68 is provided with a pear-shaped opening 70 through which the reduced diameter portion 58' of the stand-off 58 extends, the link 68 being retained on the stand-off between the retaining ring 66 and the gear 62.

The manual tuning knob 28 is adapted to be fixed to a drive shaft 72 the inner end 72' of which is knurled, and a pinion 74 is received on the knurled shaft portion 72' so as to rotate with the shaft 72, and consequently with the knob 28. The shaft 72 is designed to be mounted on the front plate or escutcheon of the radio or receiver by means of a bushing 76 the periphery of which is threaded so as to be receivable in said front plate. The location of that bushing 76 in the front plate, and hence the location of the input shaft 72 and the knob 28, will vary from set model to set model, and, as has been indicated, according to present set requirements is today usually located some place within the rectangle defined by the points A1, A2, A3 and A4 in FIGS. 7-9. The gear 74 must mesh with the gear 62 in order to provide the desired gear drive. Once the desired position of the bushing 76 and input shaft 72 has been determined, the gear 62 and pinion 60 are appropriately positioned, through pivoting of the link 50 about the shaft 11 and rotation of the pinion 60 about the periphery of the gear 40, until simultaneous mesh is achieved between the gears 40 and 60 and the gears 62 and 74.

Figure 9:
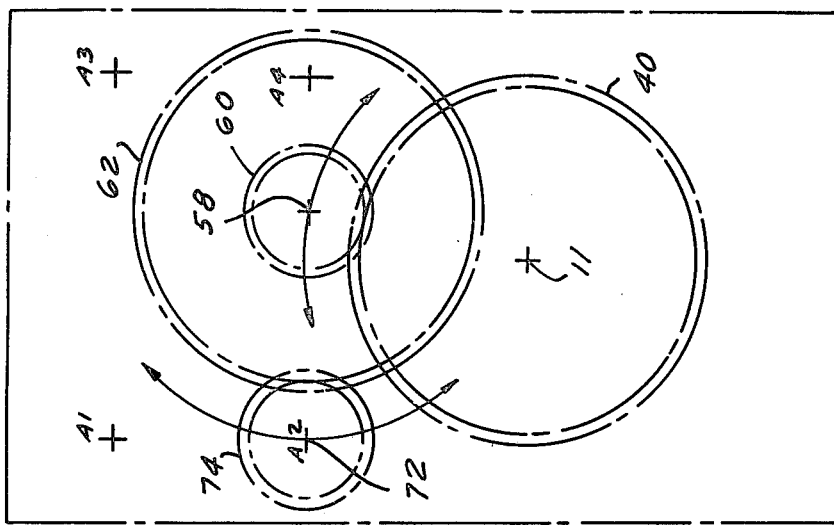
FIGS. 7, 8 and 9 are diagrammatic showings of different positions that the gears may assume to enable the input member to be located in different positions relative to the control member.
Figure 8:
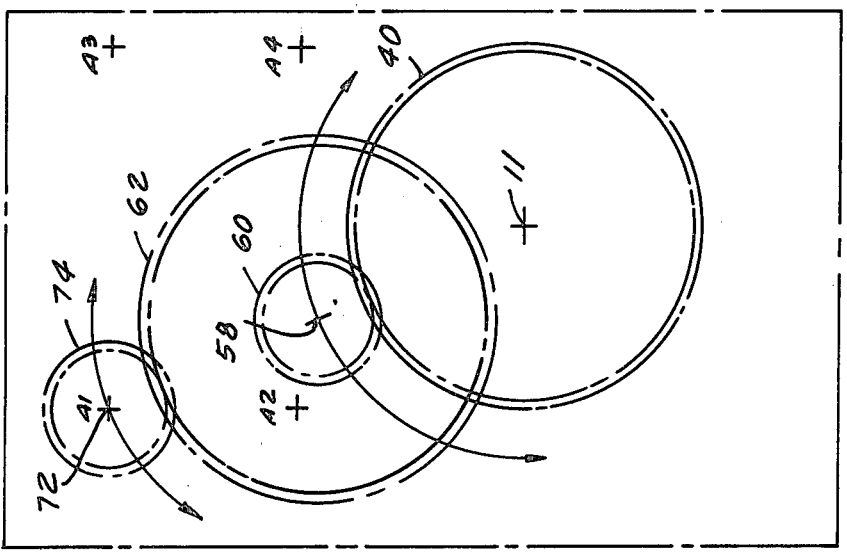
Figure 7:
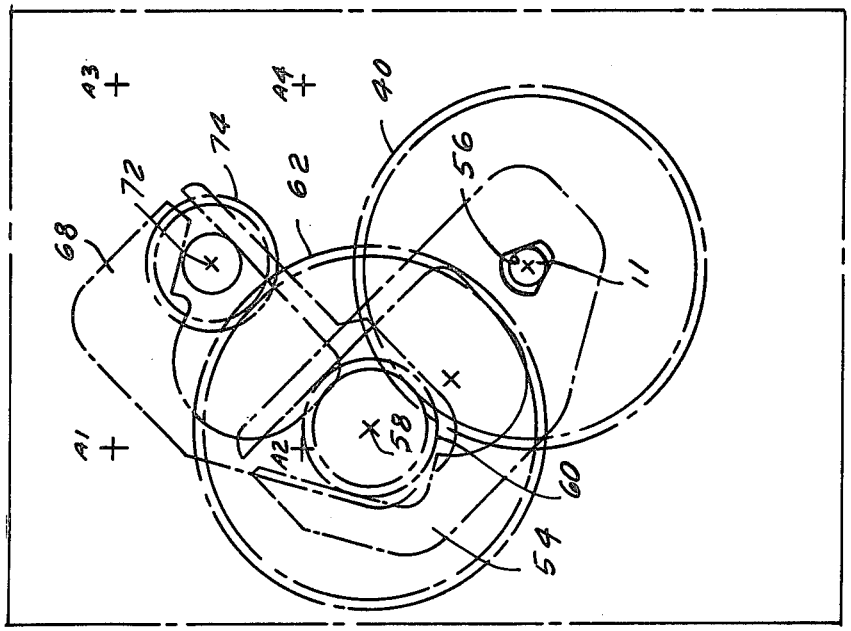

FIG. 7 shows one particular relative orientation of the pivot link 50 in order to permit the axis of the input shaft 72 to be in the center of the rectangle previously described. FIG. 8 shows the orientation of the parts when the axis of the input shaft 72 is at point A1, and FIG. 9 shows the orientation of the parts when the axis of the input shaft 72 is located at point A2. These three FIGS. 7-9 are exemplary of the relative positions that the parts may assume, and it is apparent from them that the axis of the input shaft 72 may be located anyplace within the rectangle in question and, indeed, at many positions outside that rectangle, all without requiring any change whatsoever in the mechanical construction involved.

In the above description reference has been made to the lower and upper spring links 54 and 68. Those spring links 54 and 68 are designed to ensure that the gear train has a vanishingly small mount of backlash, and therefore will produce smooth and accurate tuning. To that end each of the links is provided with a central opening 78 of appreciable size (see FIG. 6), defined on one side by a substantially straight arm 80 and defined at the top of the other side by another arm 82 having a surface 84 which is inclined upwardly and twoard the arm 80. The links 54 and 68 are formed of a resilient metallic material such that the arm 80 normally tends to assume a position close to the tip of the arm 82.

The pear-shape of the mounting holes 56 and 70 in the links 54 and 68 respectively are oriented in a direction such that the translatory forces to which those links are subjected in use urge the tapered portions of those holes against the shafts passing therethrough, thereby minimizing lost motion or backlash.

For the link 54 mounted on the shaft 11 the space between the arm 80 and the surface 84 on the arm 82 is such as to receive therebetween the surface 64 integral with and located between the gears 60 and 62. The size of the surface 64 is such that when it engages the surface 84 it will also engage the arm 80 and force that arm 80 out away from the tip of the arm 82. The arm 80 will thus tend to urge the surface 64 against the surface 84 in such a direction as to cause the gear 60 to be moved down into firm meshing engagement with the gear 40, thereby to eliminate backlash between those two gears. The upper spring link 68 mounted on the stand-off 58 has its arms and surfaces so configured as to receive a portion of the shaft 72 between the arm 80 and the surface 84, that shaft portion forcing the arm 80 outwardly away from the tip of the arm 82, the arm 80 thus resiliently pressing the shaft 72 against the inclined surface 84, thereby to urge the shaft 72, and with it the pinion 74, downwardly toward the gear 62, thus producing a snug meshing and the elimination of backlash between the gears 74 and 62.

For any given set installation, with the input shaft 72 mounted fixedly in the receiver front plate except for rotation, the relative positions of the gears 74 and 62, 60 and 40 will be fixed. The movement of the gear 60 around the periphery of the gear 40, and the positioning of the pinion 74 at a particular place on the periphery of the gear 62, is provided in order to enable the shaft 72 to be located, within limits, anywhere that is desired on the set, but once the shaft 72 has been located, the gear arrangement will be fixed in, for example, the position shown in FIG. 7, in FIG. 8 or FIG. 9 or any other position appropriate to the desired location of the input shaft 72. With the parts thus arranged, rotation of the knob 28 will cause rotation of the input shaft 72 and the pinion 74, that will cause rotation of the gear 62 and the pinion 60, that will cause rotation of the gear 40, and rotation of the gear 40 will be transmitted by the clutch facing 42 to the clutch plate 38 and the pinion 10, and rotation of the pinion 10 will cause translation of the rack 8 and hence of the tuning cores 4. Because of the action of the spring links 54 and 68 on the gears 60 and 74 respectively, backlash in this multi-gear transmission is essentially eliminated.

When a pushbutton 12 is pressed in the declutch lever 26 will be pivoted in a clockwise direction about its right-hand end as viewed in FIG. 1. That declutch lever is provided with an opening 86 through which a portion of the pinion-clutch plate 38 subassembly is received, and when the declutch lever 26 thus pivots, the pinion 10 and clutch plate 38 are moved laterally to the right, compressing the declutch spring 44 and disconnecting the pinion 10 from the gear 40, the pinion 10 and clutch plate 38 thus being free to rotate as the rack 8 is moved by the actuated pushbutton 12.

As illustrated in FIGS. 1 and 5, the rack 8 is formed integrally with the tuning bar 6. This has the advantage of manufacturing simplicity, but has the disadvantage that any warpage which might occur in either the main frame, coil housing or carriage might well give rise to errors in the proper meshing of the rack 8 with the drive pinion 10. Warpage in one direction might lead to sloppy meshing with consequent lost motion and backlash or even to intermittent or non-existent meshing, while warpage in the other direction might lead to overly tight meshing, making operation difficult, and distortion or breaking of various parts.

The construction shown in FIGS. 10 and 11 avoids these effects. In this embodiment the tuning bar 6 and the rack 8 are made in separate pieces 6a and 8a respectively. The bar 6a, at its end where the rack 8a is to be connected thereto, is provided with a pivotal post 100 having a groove 102 formed therein. The rack 8a is defined by a part having gear teeth 8b on the upper surface thereof, having a pear-shaped opening 104 formed at one end thereof with the pear shape tapering downwardly toward the other end thereof, having an opening 106 formed in the body portion thereof, and having a lip 108 formed therein adjacent the end thereof opposite that which carries opening 104. A coil spring 110 has one end 112 hooked under the lip 108, a body which is at least partially received in the opening 106, and the other end 114 thereof hooked into the groove 102 in the pivotal post 100 of the bar 6a after that post 100 has been passed through the opening 104. The spring 8', as in the first described embodiment, is compressed between the bottom wall of the housing, and the rack 8a, urging that rack 8a upwardly so that its teeth 8b mesh properly with the teeth of the pinion 10. The pivotal mounting of the rack 8a on the pivotal post 100 of the bar 6a enables the spring 8a to achieve proper meshing even though substantial warpage may have taken place in the parts. The spring 110, by pulling the post 100 into the narrowed portion of the pear-shaped opening 104, eliminates lost motion or backlash between the rack 8a and the bar 6a.

From the above it will be seen that a single standardized construction can be used in tuners having widely different requirements for the location of the input shaft relative to the tuner proper, and that the parts may be constructed without any particularly great degree of mechanical precision, all without sacrifice of accuracy or ease and smoothness of tuning.

While but a single embodiment of the present invention has been here specifically disclosed, it will be apparent that many variations may be made therein, all within the scope of the instant invention as defined in the following claims:

We claim:

1. In a tuner comprising an electrical tuning system having a movable control member, a support, means for mounting said tuning system on said support in a given position, a rotatable input member, and an operative driving connection between said control member and said input member; the improvement which comprises first gear means drivingly connected to said control member and mounted on said support to be rotatable about a first and fixed axis, second gear means mounted on said support to be adjustably positionable about the periphery of said first gear means, third gear means mounted to be adjustably positionable about the periphery of said second gear means, means defining a rotatable driving connection from said first gear means through said second gear means to said third gear means, and means operatively connecting said input member and said third gear means for driving connection and fixed relative positioning therebetween, whereby said input member may be located relative to said control member in one of a plurality of positions, said second gear means comprising first and second coaxially mounted and simultaneously rotatable gears, said first gear meshing with said first gear means and said second gear meshing with said third gear means, and means for resiliently urging one of said gear means against the periphery of another of said gear means.

2. The tuner of claim 1, in which said resilient urging means comprises a bracket comprising a pair of arms, one of said arms having an operative surface inclined radially inwardly toward the periphery of said other of said gear means and the other of said arms having a surface opposing said operative surface, and a part operatively connected to said one of said gear means received between said arms and engaging both of said surfaces, and means resiliently urging said arms together.

3. The tuner of claim 2, in which said bracket active on said one of said gear means is mounted substantially coaxially with said other of said gear means.

4. The tuner of claim 3, in which said other of said gear means is mounted on a first shaft and said bracket active on said one of said gear means is mounted on said first shaft.

5. The tuner of claim 1, in which said second gear means comprises said one of said gear means and said first gear means comprises said other of said gear means, and means for resiliently urging said third gear means against the periphery of said second gear means.

6. The tuner of claim 5, in which said resilient urging means active on said third gear means comprises a bracket comprising a pair of arms, one of said arms having an operative surface inclined radially inwardly toward the periphery of said one of said gear means and the other of said arms having a surface opposing said operative surface, and a part operatively connected to said third of said gear means received between said arms and engaging both of said surfaces, and means resiliently urging said arms together.

7. The tuner of claim 6, in which said bracket active on said third gear means is mounted substantially coaxially with said second gear means.

8. The tuner of claim 6, in which said second gear means is mounted on a second shaft and said bracket active on said third gear means is mounted on said second shaft.

9. The tuner of claim 1, means for resiliently urging each of two of said gear means against the periphery of a respective other one of said gear means.

10. The tuner of claim 9, in which said resilient urging means comprises a bracket comprising a pair of arms, one of said arms having an operative surface inclined radially inwardly toward said periphery of said second gear means and the other of said arms having a surface opposing said operative surface, and a part operatively connected to said third gear means received between said arms and engaging both of said surfaces, and means resiliently urging said arms together.

11. In the tuner of claim 10, in which said bracket active on said third gear means is mounted substantially coaxially with said second gear means.

12. The tuner of claim 10, in which said second gear means is mounted on a second shaft and said bracket active on said third gear means is mounted on said second shaft.

13. In the tuner of claim 10, a stand-off mounted on said support and having an axis, an arm extending from said stand-off substantially at right angles to said axis and adjustably rotatable about said axis, said second gear means being rotatably mounted on said arm and said bracket active on said third gear means being mounted on said arm.

14. In the tuner of claim 10, a stand-off mounted on said support and having an axis, an arm extending from said stand-off substantially at right angles to said axis and adjustably rotatable about said axis, said second gear means being rotatably mounted on said arm and said bracket active on said third gear means being mounted on said arm substantially coaxially with said second gear means.

15. In the tuner of claim 1, a stand-off mounted on said support and having an axis, an arm extending from stand-off approximately at right angles to said axis and adjustably rotatable about said axis, said second gear means being rotatably mounted on said arm.

16. In a tuner comprising an electrical tuning system having a movable control member, a support, means for mounting said tuning system on said support in a given position, a rotatable input member, and an operative driving connection between said control member and said input member; the improvement which comprises first gear means drivingly connected to said control member and mounted on said support to be rotatable about a first and fixed axis, second gear means mounted on said support to be adjustably positionable about the periphery of said first gear means, third gear means mounted to be adjustably positionable about the periphery of said second gear means, means defining a rotatable driving connection from said first gear means through said second gear means to said third gear means, and means operatively connecting said input member and said third gear means for driving connection and fixed relative positioning therebetween, whereby said input member may be located relative to said control member in one of a plurality of positions, and means for resiliently urging one of said gear means against the periphery of another of said gear means.

17. The tuner of claim 16, in which said resilient urging means comprises a bracket comprising a pair of arms, one of said arms having an operative surface inclined radially inwardly toward the periphery of said other of said gear means and the other of said arms having a surface opposing said operative surface, and a part operatively connected to said one of said gear means received between said arms and engaging both of said surfaces, and means resiliently urging said arms together.

18. The tuner of claim 17, in which said bracket active on said one of said gear means is mounted substantially coaxially with said other of said gear means.

19. The tuner of claim 17, in which said other of said gear means is mounted on a first shaft and said bracket active on said one of said gear means is mounted on said first shaft.

20. The tuner of claim 16, in which said second gear means comprises said one of said gear means and said first gear means comprises said other of said gear means, and means for resiliently urging said third gear means against the periphery of said second gear means.

21. The tuner of claim 20, in which said resilient urging means active on said third gear means comprises a bracket comprising a pair of arms, one of said arms having an operative surface inclined radially inwardly toward the periphery of said one of said gear means and the other of said arms having a surface opposing said operative surface, and a part operatively connected to said third of said gear means received between said arms and engaging both of said surfaces, and means resiliently urging said arms together.

22. The tuner of claim 21, in which said bracket active on said third gear means is mounted substantially coaxially with said second gear means.

23. The tuner of claim 21, in which said second gear means is mounted on a second shaft and said bracket active on said third gear means is mounted on said second shaft.

24. The tuner of claim 16, means for resiliently urging each of two of said gear means against the periphery of a respective other one of said gear means.

25. The tuner of claim 16, in which said resilient urging means comprises a bracket comprising a pair of arms, one of said arms having an operative surface inclined radially inwardly toward said periphery of said second gear means and the other of said arms having a surface opposing said operative surface, and a part operatively connected to said third gear means received between said arms and engaging both of said surfaces, and means resiliently urging said arms together.

26. The tuner of claim 25, in which said bracket active on said third gear means is mounted substantially coaxially with said second gear means.

27. The tuner of claim 25, in which said second gear means is mounted on a second shaft and said bracket active on said third gear means is mounted on said second shaft.

28. In the tuner of claim 25, a stand-off mounted on said support and having an axis, an arm extending from said stand-off substantially at right angles to said axis and adjustably rotatable about said axis, said second gear means being rotatably mounted on said arm and said bracket active on said third gear means being mounted on said arm.

29. In the tuner of claim 25, a stand-off mounted on said support and having an axis, an arm extending from said stand-off substantially at right angles to said axis and adjustably rotatable about said axis, said second gear means being rotatably mounted on said arm and said bracket active on said third gear means being mounted on said arm substantially coaxially with said second gear means.

30. In the tuner of claim 16, a stand-off mounted on said support and having an axis, an arm extending from stand-off approximately at right angles to said axis and adjustably rotatable about said axis, said second gear means being rotatably mounted on said arm.

* * * * *